(12) United States Patent
Liu

(10) Patent No.: US 12,217,818 B2
(45) Date of Patent: Feb. 4, 2025

(54) BIAS GENERATION CIRCUIT AND MEMORY CIRCUIT

(71) Applicant: CHANGXIN MEMORY TECHNOLOGIES, INC., Hefei (CN)

(72) Inventor: Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 209 days.

(21) Appl. No.: 18/154,937

(22) Filed: Jan. 16, 2023

(65) Prior Publication Data

US 2023/0290385 A1    Sep. 14, 2023

Related U.S. Application Data

(63) Continuation of application No. PCT/CN2022/099536, filed on Jun. 17, 2022.

(30) Foreign Application Priority Data

Mar. 11, 2022    (CN) .......................... 202210238528.7

(51) Int. Cl.
   *G11C 29/00*    (2006.01)
   *G11C 5/14*    (2006.01)
   *G11C 7/10*    (2006.01)

(52) U.S. Cl.
   CPC .............. *G11C 5/146* (2013.01); *G11C 5/147* (2013.01); *G11C 7/1084* (2013.01)

(58) Field of Classification Search
   CPC ....... G11C 5/146; G11C 5/147; G11C 7/1084; G11C 7/225

USPC ...................................................... 365/189.09
See application file for complete search history.

(56) References Cited

U.S. PATENT DOCUMENTS

| | | | |
|---|---|---|---|
| 4,092,639 A | 5/1978 | Schoeff | |
| 5,940,322 A * | 8/1999 | Atsumi | G11C 16/24 365/189.09 |
| 6,342,816 B1 | 1/2002 | Gradzki | |
| 6,356,488 B1 | 3/2002 | Kang | |

(Continued)

FOREIGN PATENT DOCUMENTS

| | | |
|---|---|---|
| CN | 1366732 A | 8/2002 |
| CN | 102103950 A | 6/2011 |

(Continued)

OTHER PUBLICATIONS

Non-Final Office Action of the U.S. Appl. No. 17/869,796, issued on May 1, 2023. 13 pages.

(Continued)

*Primary Examiner* — Huan Hoang
(74) *Attorney, Agent, or Firm* — Syncoda LLC; Feng Ma

(57) ABSTRACT

A bias generation circuit and a memory circuit are provided. The bias generation circuit includes: a first load circuit coupled between a working voltage and a regulating node; a bias circuit configured to receive the working voltage and output a bias voltage according to the working voltage; a voltage stabilizing circuit coupled to an output end of the bias circuit and configured to receive a reference voltage and regulate a voltage of the regulating node according to the bias voltage and the reference voltage; and a second load circuit having one end coupled to the output end of the bias circuit and the other end coupled to the regulating node.

20 Claims, 11 Drawing Sheets

(56) References Cited

U.S. PATENT DOCUMENTS

| | | | |
|---|---|---|---|
| 9,876,489 B1 | 1/2018 | Casey | |
| 10,725,122 B2 | 7/2020 | Rubinsztain | |
| 11,770,322 B1 * | 9/2023 | Fuentes | H04L 43/50 |
| | | | 375/224 |
| 2005/0237105 A1 | 10/2005 | Park | |
| 2008/0231372 A1 | 9/2008 | Chen | |
| 2011/0309808 A1 | 12/2011 | Zanchi | |
| 2012/0007680 A1 | 1/2012 | Hijikata | |
| 2016/0246318 A1 * | 8/2016 | Zanchi | G05F 1/575 |
| 2020/0177022 A1 | 6/2020 | Goto | |
| 2023/0236615 A1 * | 7/2023 | Pang | G05F 1/618 |
| | | | 323/273 |

FOREIGN PATENT DOCUMENTS

| | | |
|---|---|---|
| CN | 102386040 A | 3/2012 |
| CN | 103455072 A | 12/2013 |
| CN | 105404351 B | 9/2017 |
| CN | 107179797 B | 8/2018 |
| CN | 109995324 A | 7/2019 |
| CN | 110377088 A | 10/2019 |
| CN | 112803900 A | 5/2021 |
| CN | 113949344 A | 1/2022 |

OTHER PUBLICATIONS

International Search Report in the international application No. PCT/CN2022/099536, mailed on Dec. 15, 2022. 4 pages.

International Search Report in the international application No. PCT/CN2022/091771, mailed on Dec. 5, 2022. 4 pages.

\* cited by examiner

BIAS GENERATION CIRCUIT AND MEMORY CIRCUIT

CROSS-REFERENCE TO RELATED APPLICATIONS

This is a continuation of International Patent Application No. PCT/CN2022/099536, filed on Jun. 17, 2022, which claims priority to Chinese patent application No. 202210238528.7, filed on Mar. 11, 2022 and entitled "BIAS GENERATION CIRCUIT AND MEMORY CIRCUIT". The disclosures of International Patent Application No. PCT/CN2022/099536 and Chinese patent application No. 202210238528.7 are hereby incorporated by reference in their entireties.

BACKGROUND

In a semiconductor device, a power converter or a working power supply may be used to convert a working voltage to a desired voltage to supply power to one or more electronic devices. An auxiliary bias power supply for powering various circuits of the working power supply can be generated based on the working power supply. For example, a working voltage can be converted into a bias voltage by a bias generation circuit.

However, the bias voltage generated based on the bias generation circuit is prone to change due to change of other voltages in the circuit, such that the bias voltage cannot be within a stable value range, which is adverse to a stable working state of other circuits that receive the bias voltage to work.

SUMMARY

The embodiments of the disclosure relate to a bias generation circuit and a memory circuit.

A first aspect of the embodiments of the disclosure provides a bias generation circuit, including: a first load circuit coupled between a working voltage and a regulating node; a bias circuit configured to receive the working voltage and output a bias voltage according to the working voltage; a voltage stabilizing circuit which is coupled to an output end of the bias circuit and configured to receive a reference voltage and regulate a voltage of the regulating node according to the bias voltage and the reference voltage; and a second load circuit having one end coupled to the output end of the bias circuit and the other end coupled to the regulating node.

A second aspect of the embodiments of the disclosure provides a memory circuit, including: a bias generation circuit, and an input buffer circuit. The bias generation circuit includes: a first load circuit coupled between a working voltage and a regulating node; a bias circuit configured to receive the working voltage and output a bias voltage according to the working voltage; a voltage stabilizing circuit which is coupled to an output end of the bias circuit and configured to receive a reference voltage and regulate a voltage of the regulating node according to the bias voltage and the reference voltage; and a second load circuit having one end coupled to the output end of the bias circuit and the other end coupled to the regulating node. The input buffer circuit is coupled to the output end of the bias circuit.

BRIEF DESCRIPTION OF THE DRAWINGS

One or more embodiments are illustrated by way of figures in the corresponding drawings, which are not to be construed as limiting the embodiments, elements having same reference numeral signs in the drawings represent similar elements, unless otherwise stated, and the figures in the drawings are not to be construed as limiting to scale. In order to describe the technical solutions in the embodiments of the disclosure or the relevant art more clearly, the drawings required to be used in the embodiments will be simply introduced below, it is apparent that the drawings described below are only some embodiments of the disclosure, and other drawings may further be obtained by those of ordinary skill in the art according to the drawings without creative work.

DETAILED DESCRIPTION

From the background part, a bias voltage generated by a bias generation circuit at present is not stable.

Figure 1:
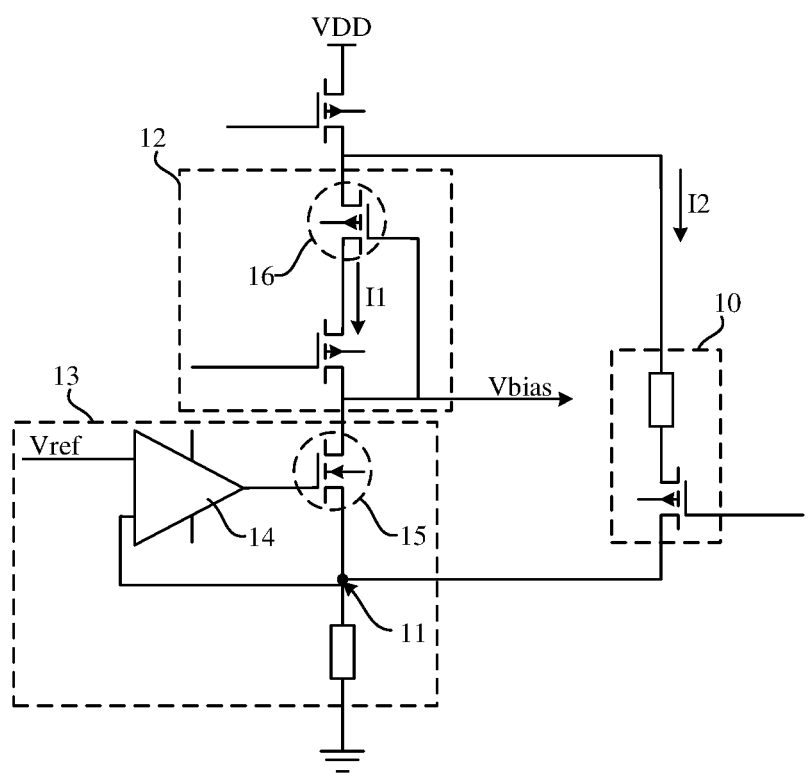
FIG. 1 is a schematic circuit diagram of a bias generation circuit.

FIG. 1 is a schematic circuit diagram of a bias generation circuit. Referring to FIG. 1, the bias generation circuit includes: a load circuit 10 coupled between a working voltage VDD and a connecting node 11; a bias circuit 12 configured to receive the working voltage VDD and output a bias voltage Vbias according to the working voltage VDD; and a voltage stabilizing circuit 13 coupled to an output end of the bias circuit 12 and configured to receive a reference voltage Vref and regulate the bias voltage Vbias according to the reference voltage Vref and the voltage of the connecting node 11.

If the working voltage VDD increases, a current I2 flowing through the load circuit 10 increases, and a voltage of the connecting node 11 to increases, a difference between the reference voltage Vref and the voltage of the connecting node 11 increases, a voltage outputted by an output end of the operational amplifier 14 is reduced with the increase of the difference between the reference voltage Vref and the voltage of the connecting node 11, a voltage received by a control end of an NMOS transistor 15 coupled to the output end of the operational amplifier in the voltage stabilizing circuit 13 decreases, which reduces the degree of conduction of the NMOS transistor 15 or causes the NMOS transistor 15 to be turned off. In such a case, a current I1 in the bias circuit 12 decreases or is zero, and a voltage of a control end of a PMOS transistor 16 approaches a voltage at an end, coupled to the working voltage, of the PMOS transistor 16, that is, the bias voltage Vbias approaches the working voltage VDD.

According to analysis, in the bias generation circuit at present, the bias voltage Vbias outputted by the bias circuit 12 increases with the increase of the working voltage VDD, which results in that the bias voltage Vbias outputted by the bias circuit 12 is not in a stable value range, and other circuits that receive the bias voltage Vbias to work may fail to work because of the increase of the received bias voltage Vbias. Therefore, it is urgent to design a bias generation circuit for generating a bias voltage with a stable value.

The embodiments of the disclosure provide a bias generation circuit, a voltage stabilizing circuit is coupled to an output end of a bias circuit and a regulating node, and one end of a second load circuit is also coupled to the output end of the bias circuit and the regulating node. Therefore, the current passing through the bias circuit can be jointly regulated through both the voltage stabilizing circuit and the second load circuit, such that the bias circuit outputs a bias voltage within a stable value range. When a working voltage is stable, the voltage stabilizing circuit can control a voltage of the regulating node to be a fixed voltage value, to stabilize the current passing through the bias circuit, and output a stable bias voltage. When a working voltage is excessively high, compared with a bias generation circuit without a second load circuit, a current in the bias circuit can be increased through the second load circuit. With the above two aspects, the bias voltage outputted by the bias circuit can be avoided from increasing or decreasing excessively with change of the working voltage, and the bias circuit outputs a bias voltage within a stable value range, and other circuits that receive the bias voltage to work are in a stable working state.

In order to make the purposes, technical solutions and advantages of the embodiments of the disclosure clearer, the embodiments of the disclosure will be described in detail below in combination with the drawings. However, it will be appreciated by those of ordinary skill in the art that in the embodiments of the disclosure, numerous technical details are set forth in order to provide a better understanding of the embodiments of the disclosure. However, the technical solutions claimed in the embodiments of the disclosure may be implemented even without these technical details and various changes and modifications based on the following embodiments.

An embodiment of the disclosure provides a bias generation circuit, which is described in detail below in combination with the drawings. FIGS. 2-10 are nine schematic circuit diagrams of a bias generation circuit provided by an embodiment of the disclosure.

Figure 2:
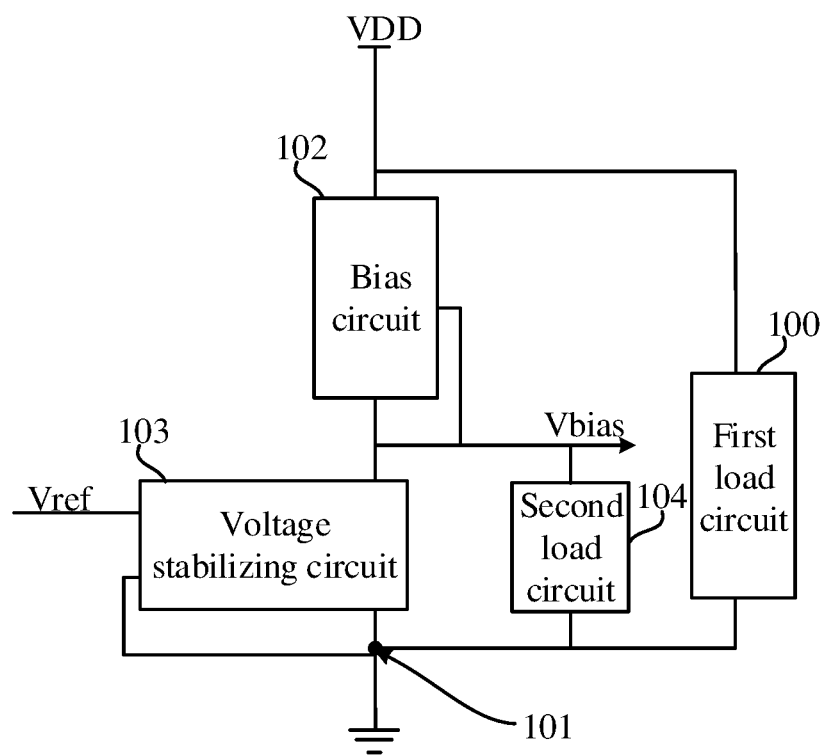
FIG. 2 is a schematic circuit diagram of a bias generation circuit provided by an embodiment of the disclosure.

Referring to FIG. 2, the bias generation circuit includes: a first load circuit 100 coupled between a working voltage VDD and a regulating node 101; a bias circuit 102 configured to receive the working voltage VDD and output a bias voltage Vbias according to the working voltage VDD; a voltage stabilizing circuit 103 coupled to an output end of the bias circuit 102 and configured to receive a reference voltage Vref and regulate a voltage of the regulating node 101 according to the bias voltage Vbias and the reference voltage Vref; and a second load circuit 104 having one end coupled to the output end of the bias circuit 102 and the other end coupled to the regulating node 101.

Therefore, on one hand, the voltage stabilizing circuit 103 is coupled to the output end of the bias circuit 102, and the voltage stabilizing circuit 103 can provide a conductive path between the output end of the bias circuit 102 and the regulating node 101. On the other hand, one end of the second load circuit 104 is coupled to the output end of the bias circuit 102, the other end of the second load circuit 104 is coupled to the regulating node 101, and the second load circuit 104 can provide another conductive path between the output end of the bias circuit 102 and the regulating node 101.

Therefore, a current in the bias circuit 102 is affected by both the voltage stabilizing circuit 103 and the second load circuit 104. Compared with the common bias generation circuit at present in which the output end of the bias circuit 102 is coupled to the regulating node only via the voltage stabilizing circuit and a current in the bias circuit is only affected by the voltage stabilizing circuit, the output end of the bias circuit 102 in the bias generation circuit provided by the embodiment of the disclosure can be coupled to the regulating node 101 via the voltage stabilizing circuit 103 and also can be coupled to the regulating node 101 via the second load circuit 104. Therefore, in a case that when the working voltage VDD changes, regulating capacity of the voltage stabilizing circuit 103 on a voltage of the regulating node 101 is reduced and regulating capacity of the voltage stabilizing circuit 103 on a current flowing through the bias circuit 102 is reduced, the voltage stabilizing circuit 103 can be assisted by the second load circuit 104 to regulate the current flowing through the bias circuit 102. In this way, the current flowing through the bias circuit 102 is within a stable value range, and the bias circuit 102 outputs the bias voltage Vbias within a stable value range based on the stable current in the bias circuit 102. Therefore, other circuits that receive the bias voltage Vbias to work are in a stable working state.

The bias generation circuit provided by the embodiment of the disclosure is described in detail below in combination with the drawings.

Two embodiments are provided below to describe in detail about the specific case where the first load circuit 100 is coupled between the working voltage VDD and the regulating node 101.

In some embodiments, referring to FIG. 2, the case that the first load circuit 100 is coupled to the working voltage VDD includes that the first load circuit 100 is directly electrically connected to the working voltage VDD without indirect electric connection of other circuits or electronic devices between the first load circuit and the working voltage VDD.

Figure 3:
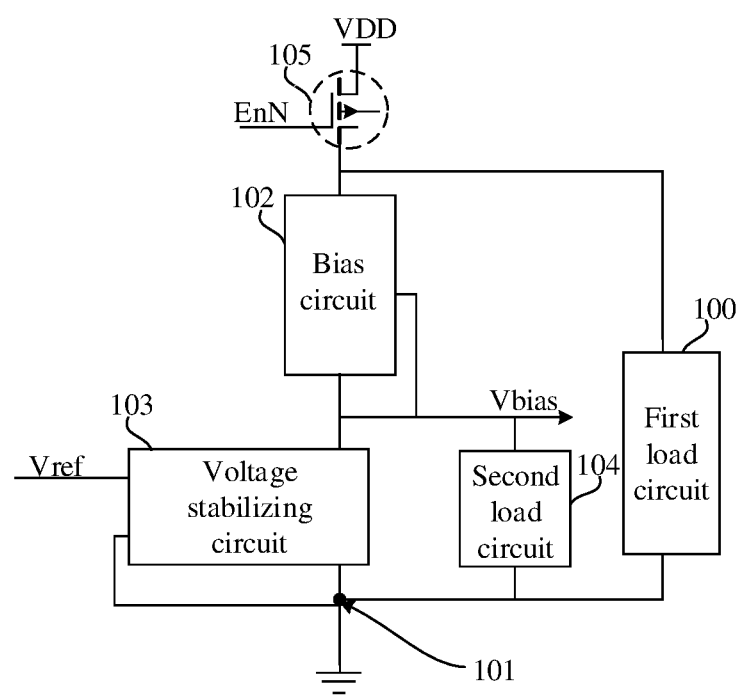
FIG. 3 is a schematic circuit diagram of a bias generation circuit provided by an embodiment of the disclosure.

In some other embodiments, referring to FIG. 3, the bias generation circuit further includes a switch circuit 105 configured to be turned on, in response to an enable signal EnN, to enable the first load circuit 100 to be coupled to the working voltage VDD via the switch circuit 105, and enable the bias circuit 102 to receive the working voltage VDD via the switch circuit 105.

In some embodiments, the switch circuit 105 may include a sixth MOS transistor. It is to be noted that a case that the switch circuit 105 includes only one sixth MOS transistor is taken as example in FIG. 3, and in practical applications, the switch circuit 105 can also be a circuit composed of a plurality of sixth MOS transistors connected in series, or a circuit composed of other single electronic device or combination of a plurality of electronic devices which can be turned on based on an enable signal. The composition of the switch circuit 105 is not limited in the embodiments of the disclosure, as long as the switch circuit 105 can be turned on in response to the enable signal EnN. It is to be noted that, in one example, the sixth MOS transistor can be a PMOS transistor. In another example, the sixth MOS transistor can be an NMOS transistor.

Figure 4:
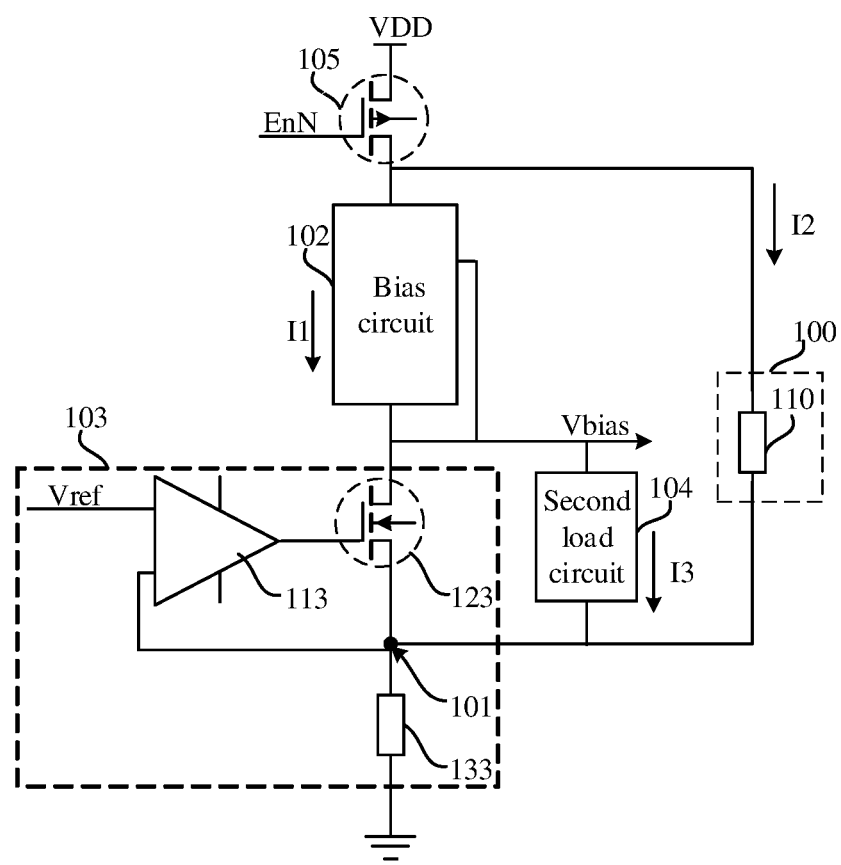
FIG. 4 is a schematic circuit diagram of a bias generation circuit provided by an embodiment of the disclosure.

In some embodiments, referring to FIG. 4, the voltage stabilizing circuit 103 may include an operational amplifier 113, a drive circuit 123 and a feedback circuit 133. A first input end of the operational amplifier 113 receives the reference voltage Vref and a second input end of the operational amplifier 113 is coupled to the regulating node 101. The drive circuit 123 is coupled to an output end of the operational amplifier 113, and is configured to receive the bias voltage Vbias and regulate a voltage of the regulating node 101 according to output of the operational amplifier 113 and the bias voltage Vbias. The feedback circuit 133 is coupled between the regulating node 101 and the ground.

It is to be noted that, the case that the second input end of the operational amplifier 113 is coupled to the regulating node 101 includes that the second input end of the operational amplifier 113 can be directly electrically connected to the regulating node 101. The case that drive circuit 123 is coupled to an output end of the operational amplifier 113 includes that the drive circuit 123 can be directly connected to the output end of the operational amplifier 113. The case that the feedback circuit 133 is coupled between the regulating node 101 and the ground includes that the feedback circuit 133 can be directly electrically connected to the regulating node 101 and to the ground.

The composition of the voltage stabilizing circuit 103 is described in detail below.

In some embodiments, referring to FIG. 4, the drive circuit 123 may include a first NMOS transistor, a control end of the first NMOS transistor is coupled to the output end of the operational amplifier 113, a first end of the first NMOS transistor is coupled to the output end of the bias circuit 102, and a second end of the first NMOS transistor is coupled to the regulating node 101.

Therefore, when the working voltage VDD increases, the current I2 flowing through the first load circuit 100 may increase, which increases the voltage of the regulating node 101. Then, at the beginning of increase of the working voltage VDD, the voltage stabilizing circuit 103 outputs a small output voltage based on the reference voltage Vref and the increased voltage of the regulating node 101. The first NMOS transistor receives the small output voltage, and a conduction degree of the first NMOS transistor is very small or the first NMOS transistor is turned off. Therefore, the voltage of the regulating node 101 cannot be effectively reduced, and the current flowing through the bias circuit 102 cannot be regulated. In such a case, a current flowing through the bias circuit 102 can be regulated through the second load circuit 104, and the current I1 in the bias circuit 102 is affected by the current I3 in the second load circuit 104, thereby ensuring that the current I1 flowing through the bias circuit 102 is in a stable value range, and the bias circuit 102 outputs a bias voltage Vbias within a stable value range based on the stable current I1 in the bias circuit 102.

In some embodiments, referring to FIG. 4, the feedback circuit 133 may include a first resistor coupled between the regulating node 101 and the ground. In other embodiments, the feedback circuit may be a plurality of first resistors connected in series, or may be at least one other electronic device such as an MOS transistor.

Three embodiments are provided below to describe in detail the composition of the first load circuit.

In some embodiments, referring to FIG. 4, the first load circuit 100 may include a second resistor 110 coupled between the working voltage VDD and the regulating node 101.

It is to be noted that the case that the second resistor 110 is coupled to the working voltage VDD may include that the second resistor 110 is electrically connected to the regulating node 101 via the switch circuit 105. In other embodiments, the case that the second resistor 110 is coupled to the working voltage VDD may include that the second resistor 110 is directly electrically connected to the working voltage VDD. The second resistor 110 can be directly connected to the regulating node 101. In FIG. 4, for example, the first load circuit 100 includes one second resistor 110. In practical applications, the first load circuit 100 may include at least two second resistors 110 connected in series.

Figure 5:
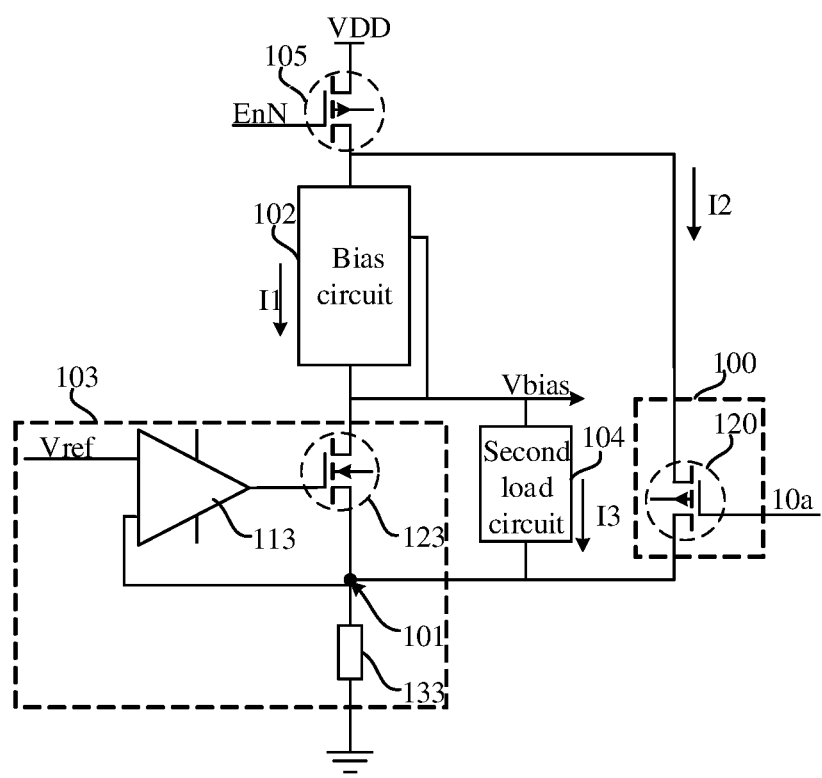
FIG. 5 is a schematic circuit diagram of a bias generation circuit provided by an embodiment of the disclosure.

In some other embodiments, referring to FIG. 5, the first load circuit 100 may include: a first MOS transistor 120, a first end of the first MOS transistor 120 is coupled to the working voltage VDD, a second end of the first MOS transistor 120 is coupled to the regulating node 101, and the first MOS transistor 120, in respond to a first control voltage signal 10a, conducts the first end of the first MOS transistor 120 and the second end of the first MOS transistor 120. The first MOS transistor may be a PMOS transistor or an NMOS transistor.

It is to be noted that the case that first end of the first MOS transistor 120 is coupled to the working voltage VDD may include that the first end of the first MOS transistor 120 is electrically connected to the working voltage VDD via the switch circuit 105. In other embodiments, the case that the first end of the first MOS transistor 120 is coupled to the working voltage VDD may include that the first end of the first MOS transistor 120 is directly electrically connected to the working voltage VDD. The second end of the first MOS transistor 120 can be directly electrically connected to the regulating node 101. In FIG. 5, for example, the first load circuit 100 includes one first MOS transistor 120. In practical applications, the first load circuit 100 may include at least two first MOS transistors 120 connected in series.

Figure 6:
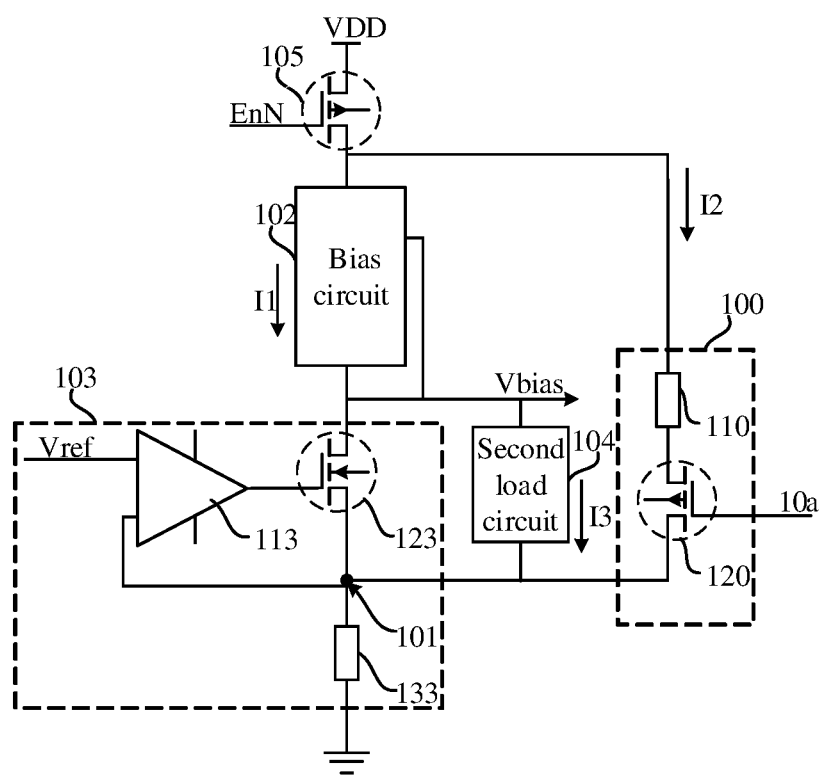
FIG. 6 is a schematic circuit diagram of a bias generation circuit provided by an embodiment of the disclosure.

In some other embodiments, referring to FIG. 6, the first load circuit 100 may include a second resistor 110, and a first MOS transistor 120. One end of the second resistor 110 is coupled to the working voltage VDD. A first end of the first MOS transistor 120 is coupled to the other end of the second resistor 110, a second end of the first MOS transistor 120 is coupled to the regulating node 101. The first MOS transistor 120, in respond to a first control voltage signal 10a, conducts the first end and the second end of the first MOS transistor 120.

It is to be noted that one end of the second resistor 110 being coupled to the working voltage VDD may include that one end of the second resistor 110 is electrically connected to the regulating node 101 via the switch circuit 105. In other embodiments, the second resistor being coupled to the working voltage VDD may include that the second resistor is directly electrically connected to the working voltage VDD. The first end of the first MOS transistor 120 can be directly electrically connected to the other end of the second resistor 110, and the second end of the first MOS transistor 120 can be directly electrically connected to the regulating node 101. In FIG. 6, for example, the first load circuit 100 includes one second resistor 110 and one first MOS transistor 120. In practical applications, the number of second resistors 110 and the number of first MOS transistors 120 are not limited, which are reasonably set according to the specific requirements of the bias generation circuit.

When the working voltage VDD is unchanged and the voltage of the regulating node 101 is stably controlled through the voltage stabilizing circuit 103, current flowing through the feedback circuit 133 is unchanged. Since the current flowing through the feedback circuit 133 is the sum of current I1 flowing through the bias circuit 102, current I2 flowing through the first load circuit 100, and current I3 flowing through the second load circuit 104, the first load circuit 100 can implement current diversion, thereby reducing the current I1 flowing through the bias circuit 102 compared with the bias generation circuit without the first load circuit 100, so that the bias circuit 102 outputs a large bias voltage Vbias based on a small current I1. Therefore, the addition of the first load circuit 100 in the bias generation circuit facilitate enabling the bias circuit 102 to output a large bias voltage Vbias while the working voltage VDD is unchanged.

In the embodiments of the disclosure, since the working voltage VDD increases, the voltage of the regulating node 101 increases, the voltage stabilizing circuit 103 output a small voltage based on the reference voltage Vref and the voltage of the regulating node 101, so that the drive circuit 123 in the voltage stabilizing circuit 103 is almost in a turn off state. Therefore, regulating capability of the voltage stabilizing circuit 103 on the voltage of the regulating node 101 is reduced, the current I1 flowing through the bias circuit 102 cannot be regulated, the current I1 in the bias circuit 102 is mainly affected by the current I3 in the second load circuit 104, the current I1 in the bias circuit 102 is larger than the current in the bias circuit in a common bias generation circuit at present, thereby avoiding from outputting excessively high bias voltage Vbias by the bias circuit 102 and enabling the bias voltage Vbias to be within a stable value range. On the other hand, when the magnitude of the bias voltage Vbias needs to be at a specified value, the magnitude of the current I3 in the second load circuit 104 can be controlled by regulating the magnitude of the resistance value wholly embodied by the second load circuit 104, to regulate the magnitude of the current I1 in the bias circuit 102 and control the magnitude of the bias voltage Vbias.

Three embodiments are provided to describe in detail the composition of the second load circuit 104.

Figure 7:
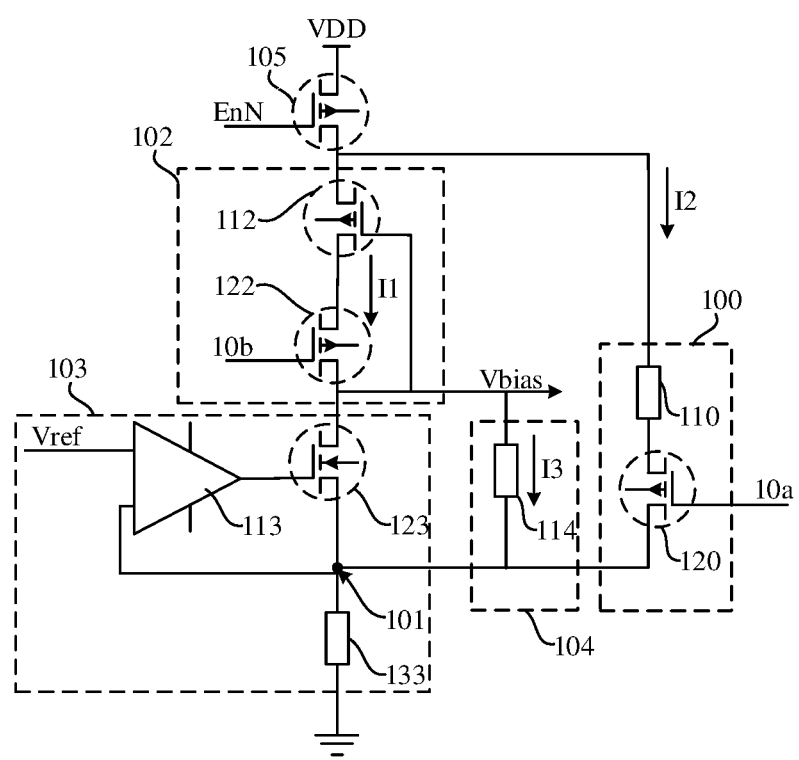
FIG. 7 is a schematic circuit diagram of a bias generation circuit provided by an embodiment of the disclosure.

In some embodiments, referring to FIG. 7, the second load circuit 104 may include a third resistor 114 coupled between the output end of the bias circuit 102 and the regulating node 101. A resistance value of the third resistor 114 may range from 15 kΩ to 25 kΩ.

It is to be noted that the coupling of the third resistor 114 to the output end of the bias circuit 102 and the regulating node 101 may each be a direct electrical connection. In FIG. 7, a case that the second load circuit 104 includes one third resistor 114 is taken as an example. In practical applications, the second load circuit 104 may include at least two third resistors 114 connected in series according to specific requirements of the bias generation circuit. For example, a resistance value of the second load circuit 104 may be set according to the magnitude of the bias voltage Vbias outputted by the bias circuit 102. In this way, it is further guaranteed that the bias voltage Vbias outputted by the bias circuit 102 is within a stable value range and other circuits which receive the bias voltage to work are in a stable working state. The resistance value embodied by the second load circuit 104 as a whole may ranges from 15 kΩ to 25 kΩ, to avoid a small resistance value of the second load circuit 104, and avoid a large current I3 in the second load circuit 104, thereby avoiding from generating a small bias voltage Vbias outputted by the bias circuit 102 based on the current I1 in the bias circuit 102.

Figure 8:
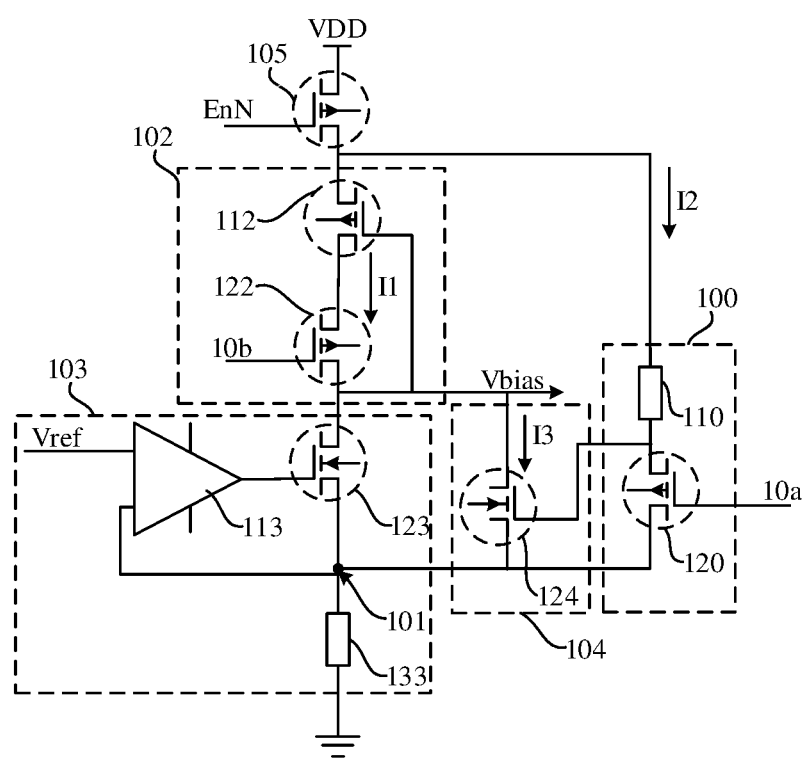
FIG. 8 is a schematic circuit diagram of a bias generation circuit provided by an embodiment of the disclosure.

In some other embodiments, referring to FIG. 8, when the first load circuit 100 includes a second resistor 110 and a first MOS transistor 120, the second load circuit 104 may include a second MOS transistor 124. A control end of the second MOS transistor 124 is coupled to the first end of the first MOS transistor 120, a first end of the second MOS transistor 124 is coupled to the output end of the bias circuit 102, and a second end of the second MOS transistor 124 is coupled to the regulating node 101. Therefore, the second MOS transistor 124 is designed in the second load circuit 104 to control the current I3 in the second load circuit 104, thereby saving arrangement space of circuit and layout and thus improving integration density of the bias generation circuit while the bias voltage Vbias is controlled to be within a stable value range.

One end of the second resistor 110 is coupled to the working voltage VDD. A first end of the first MOS transistor 120 is coupled to the other end of the second resistor 110, a second end of the first MOS transistor 120 is coupled to the regulating node 101, and the first MOS transistor 120, in respond to a first control voltage signal 10a, conduct the first end and the second end of the first MOS transistor 120.

It is to be noted that the control end of the second MOS transistor 124 can be directly electrically connected to the first end of the first MOS transistor 120, the first end of the second MOS transistor 124 can be directly electrically connected to the output end of the bias circuit 102, and the second end of the second MOS transistor 124 can be directly electrically connected to the regulating node 101.

The first MOS transistor 120 is of one of N-type or P-type, and the second MOS transistor is of the other of N-type or P-type.

In one example, the first MOS transistor 120 may be a PMOS transistor, and the second MOS transistor 124 may be an NMOS transistor. Therefore, when the voltage of the regulating node 101 increases as the working voltage VDD increases, the voltage received by the control end of the second MOS transistor 124 also increases, to improve a conduction degree of the second MOS transistor 124, thereby increasing the current I3 in the second load circuit 104, and increasing the current I1 in the bias circuit 102. Therefore, the bias circuit 102 can output a small bias voltage Vbias based on the large current I1, that is, the bias voltage Vbias outputted by the bias circuit 102 is reduced, thereby avoiding the phenomenon that the bias voltage Vbias increases greatly with increase of the working voltage VDD, and ensuring that the bias voltage Vbias is within a stable value range.

Figure 9:
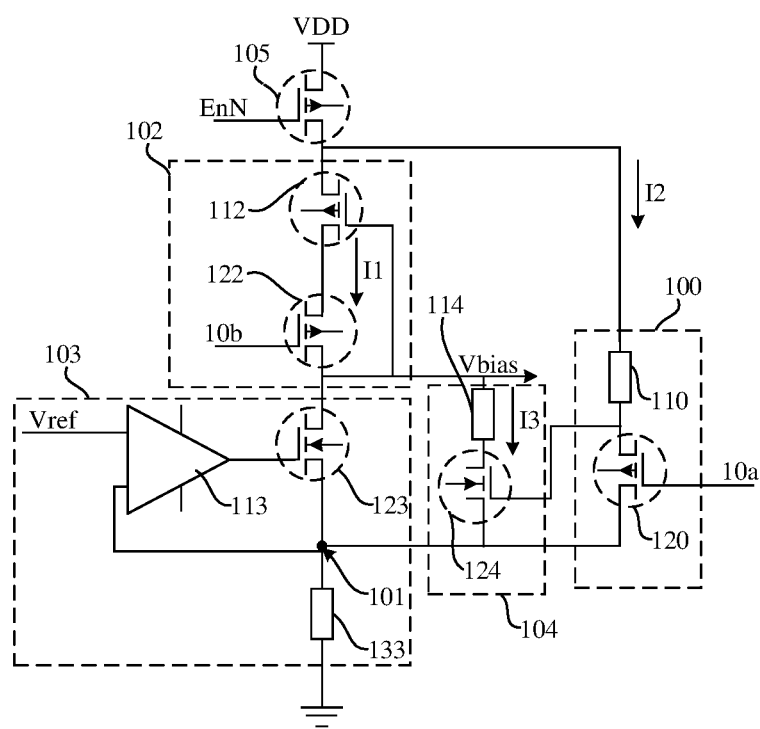
FIG. 9 is a schematic circuit diagram of a bias generation circuit provided by an embodiment of the disclosure.
Figure 10:
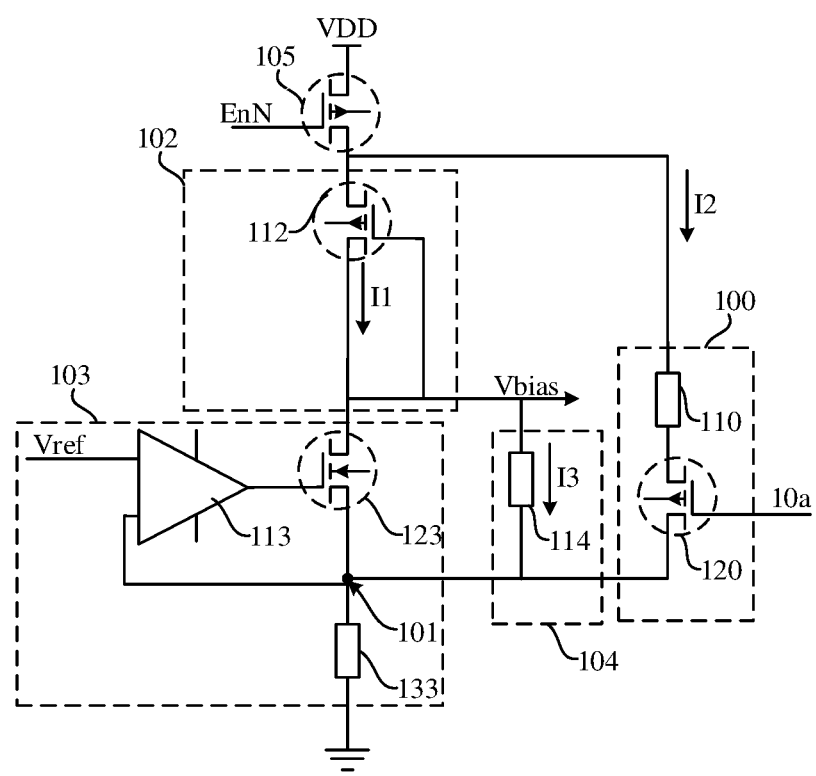
FIG. 10 is a schematic circuit diagram of a bias generation circuit provided by an embodiment of the disclosure.

In some other embodiments, referring to FIG. 9, when the first load circuit 100 includes a second resistor 110 and a first MOS transistor 120, the second load circuit 104 may include: a third resistor 114, and a second MOS transistor 124. One end of the third resistor 114 is coupled to the output end of the bias circuit 102, a control end of the second MOS transistor 124 is coupled to the first end of the first MOS transistor 120, a first end of the second MOS transistor 124 is coupled to the other end of the third resistor 114, and a second end of the second MOS transistor 124 is coupled to the regulating node 101.

To avoid that the resistance value of the second load circuit 104 is too small, the second load circuit 104 includes the third resistor 114 in addition to the second MOS transistor 124. Under the control of both the third resistor 114 and the second MOS transistor 124, the resistance value embodied by the second load circuit 104 as a whole can be within a suitable range, and the current I3 in the second load circuit 104 is stabilized within a suitable value range, thereby avoiding from resulting in a too large or too small current I3 in the second load circuit 104, and thus avoiding from resulting in a too large or too small current I1 in the bias circuit 102. In this way, the bias voltage Vbias outputted by the bias circuit 102 based on the current I1 in the bias circuit 102 is stabilized within a suitable value ranges. In addition, as compared to a resistive device, the size of the second MOS transistor 124 is small. When the resistance value embodied by the second load circuit 104 as a whole is in the suitable range by both the third resistor 114 and the second MOS transistor 124, the need for a third resistor 114 with a very large resistance value can be avoided, thereby advantageously avoiding the third resistor 114 from occupying too much arrangement space of circuit and layout, and saving the arrangement space of circuit and layout while ensuring that the resistance value embodied by the second load circuit 104 as a whole is in a suitable range. The resistance value of the third resistor 114 may range from 5 kΩ to 7 kΩ.

One end of the second resistor 110 is coupled to the working voltage VDD. A first end of the first MOS transistor 120 is coupled to the other end of the second resistor 110, a second end of the first MOS transistor 120 is coupled to the regulating node 101, and the first MOS transistor 120, in respond to a first control voltage signal 10a, conduct the first end and the second end of the first MOS transistor 120.

It is to be noted that one end of the third resistor 114 can be directly electrically connected with the output end of the bias circuit 102, the control end of the second MOS transistor 124 can be directly electrically connected with the first end of the first MOS transistor 120, the first end of the second MOS transistor 124 can be directly electrically connected to the other end of the third resistor 114, and the second end of the second MOS transistor 124 can be directly electrically connected to the regulating node 101.

The first MOS transistor 120 is of one of N-type or P-type, and the second MOS transistor 124 is of the other of N-type or P-type.

In one example, the first MOS transistor 120 may be a PMOS transistor, and the second MOS transistor 124 may be an NMOS transistor. Therefore, when the voltage of the regulating node 101 increases as the working voltage VDD increases, the voltage received by the control end of the second MOS transistor 124 also increases, to improve a conduction degree of the second MOS transistor 124, thereby increasing the current I3 in the second load circuit 104, and increasing the current I1 in the bias circuit 102. Therefore, the bias voltage outputted by the output end of the bias circuit 102 can be reduced, thereby avoiding the bias voltage Vbias from increasing with increase of the working voltage VDD, and ensuring the bias voltage Vbias is in a stable value range.

In some embodiments, the bias circuit 102 may include a third MOS transistor 112. A control end of the third MOS transistor 112 is directly coupled to the output end of the bias circuit 102, a first end of the third MOS transistor 112 is coupled to the working voltage VDD, and a second end of the third MOS transistor 112 is coupled to the output end of the bias circuit 102.

In some embodiments, the third MOS transistor 112 may be a PMOS transistor. In such a case, when the working voltage VDD increases, the regulating capacity of the voltage stabilizing circuit 103 on the voltage of the regulating node 101 is reduced, and the current I1 flowing through the bias circuit 102 cannot be regulated. In this case, the current I1 flowing through the bias circuit 102 can be regulated by the second load circuit 104, the current I1 in the bias circuit 102 is mainly affected by the current I3 in the second load circuit 104, to ensure that the current I1 flowing through the bias circuit 102 is within a stable value range, the current I1 in the bias circuit 102 is larger than the current in the bias circuit in the common bias generation circuit at present.

Then, the third MOS transistor 112, based on the larger current I1, can reduce the voltage at the control end of the third MOS transistor 112, that is, the voltage at the control end of the third MOS transistor 112 is avoided from increasing with increase of the working voltage VDD, such that the bias voltage Vbias is within a stable value range. In other embodiments, the third MOS transistor 112 may also be an NMOS transistor.

The principle that the third MOS transistor 112 can reduce the voltage at the control end of the third MOS transistor 112 based on a larger current I1 according to the following principle.

$$I1 = \frac{W}{2L}\mu_n C_{ox}(V_{GS} - V_{TH})^2$$

I1 denotes the current flowing through the third MOS transistor 112, W denotes the width of a channel region in the third MOS transistor 112, L denotes the length of the channel region in the third MOS transistor 112, ρn denotes the mobility of carriers, $C_{ox}$ denotes the thickness of a gate dielectric layer in the third MOS transistor 112, $V_{GS}$ denotes a voltage difference between the control end of the third MOS transistor 112 and the first end of the third MOS transistor 112, and $V_{TH}$ denotes a threshold voltage of the third MOS transistor 112. As the current I1 in the bias circuit 102 increases, that is, the current I1 flowing through the third MOS transistor 112 increases, $(V_{GS}-V_{TH})^2$ increases. When the third MOS transistor 112 is a PMOS transistor, $V_{GS}$ is a negative value, $V_{GS}$ should be decreased when $(V_{GS}-V_{TH})^2$ needs to be increased. Since $V_{GS}$ is the voltage difference between the control end of the third MOS transistor 112 and the first end of the third MOS transistor 112, when the voltage Vs at the first end of the third MOS transistor 112 is unchanged, a voltage $V_G$ at the control end of the third MOS transistor 112 should be reduced when $V_{GS}$ needs to be reduced. Since the voltage $V_G$ at the control end of the third MOS transistor 112 is the bias voltage Vbias outputted by the bias circuit 102, the bias voltage Vbias outputted by the bias circuit 102 can be decreased by adding the second load circuit 104 when the current I1 flowing through the third MOS transistor 112 increases, to avoid increase of the bias voltage Vbias with increase of the working voltage VDD, such that the bias voltage Vbias is within a stable value range.

In some embodiments, continuing referring to FIGS. 7-9, the bias circuit 102 may include a fourth MOS transistor 122 in addition to the third MOS transistor 112. A first end of the fourth MOS transistor 122 is coupled to the second end of the third MOS transistor 112, a second end of the fourth MOS transistor 122 is directly coupled to the output end of the bias circuit 102, and a control end of the fourth MOS transistor 122 conducts the first end and the second end of the fourth MOS transistor 122 in respond to a second control voltage signal 10b.

It is to be noted that the first end of the fourth MOS transistor 122 can be directly electrically connected to the second end of the third MOS transistor 112. The fourth MOS transistor 122 may be an NMOS transistor or a PMOS transistor.

The principle that the bias voltage Vbias outputted by the bias circuit 102 does not change with change of the working voltage VDD is described in detail with taking the bias generation circuit provided in FIG. 7 as an example.

When the working voltage increases, the current I2 flowing through the first load circuit 100 my increase, and the voltage of the regulating node 101 increases accordingly. At the beginning of increase of the working voltage VDD, a difference between the voltage of the regulating node 101 and the reference voltage Vref is large, so that the operational amplifier 113 in the voltage stabilizing circuit 103 outputs a small output voltage, the first NMOS transistor in the drive circuit 123 receives the small output voltage, so that the conduction degree of the first NMOS transistor is low or the first NMOS transistor is turned off, the current flowing through the first NMOS transistor is nearly zero, the current I1 in the bias circuit 102 is mainly affected by current I3 in the second load circuit 104. As compared with a bias generation circuit provided with no second load circuit, the current I1 flowing through the bias circuit 102 is large, and the third MOS transistor 112 in the bias circuit 102 controls the voltage at the control end of the third MOS transistor 112 to decrease based on the large current I1, to avoid an increase of the bias voltage Vbias with the increase of the working voltage VDD, such that the bias circuit 102 outputs the bias voltage Vbias within a stable value range.

When the working voltage VDD is stable, the voltage stabilizing circuit 103 can control the voltage of the regulating node 101 to be a fixed voltage value, such that the current through the bias circuit 102 is stable, and a stable bias voltage is outputted.

In some embodiments, the first control voltage signal 10a, the second control voltage signal 10b, and the reference voltage Vref may be the same.

To sum up, compared with a common bias generation circuit at present, on one hand, the voltage stabilizing circuit 103 can provide a conductive path between the output end of the bias circuit 102 and the regulating node 101. On the other hand, the second load circuit 104 may provide another conductible path between the output end of the bias circuit 102 and the regulating node 101. When a potential of the regulating node 101 increases as the working voltage VDD increases, the regulating capacity of the voltage stabilizing circuit 103 on the voltage of the regulating node 101 decreases, the regulating capability of the voltage stabilizing circuit 103 on the current flowing through the bias circuit 102 also decreases. In such a case, the voltage stabilizing circuit 103 may be assisted by the second load circuit 104 for regulating the current flowing through the bias circuit 102, thereby maintaining the current flowing through the bias circuit 102 within a stable value range, such that the bias circuit 102 outputs a bias voltage Bias within a stable value range based on the stable current I1, and other circuits for receiving the bias voltage Vbias to work are in a stable working state.

Figure 11:
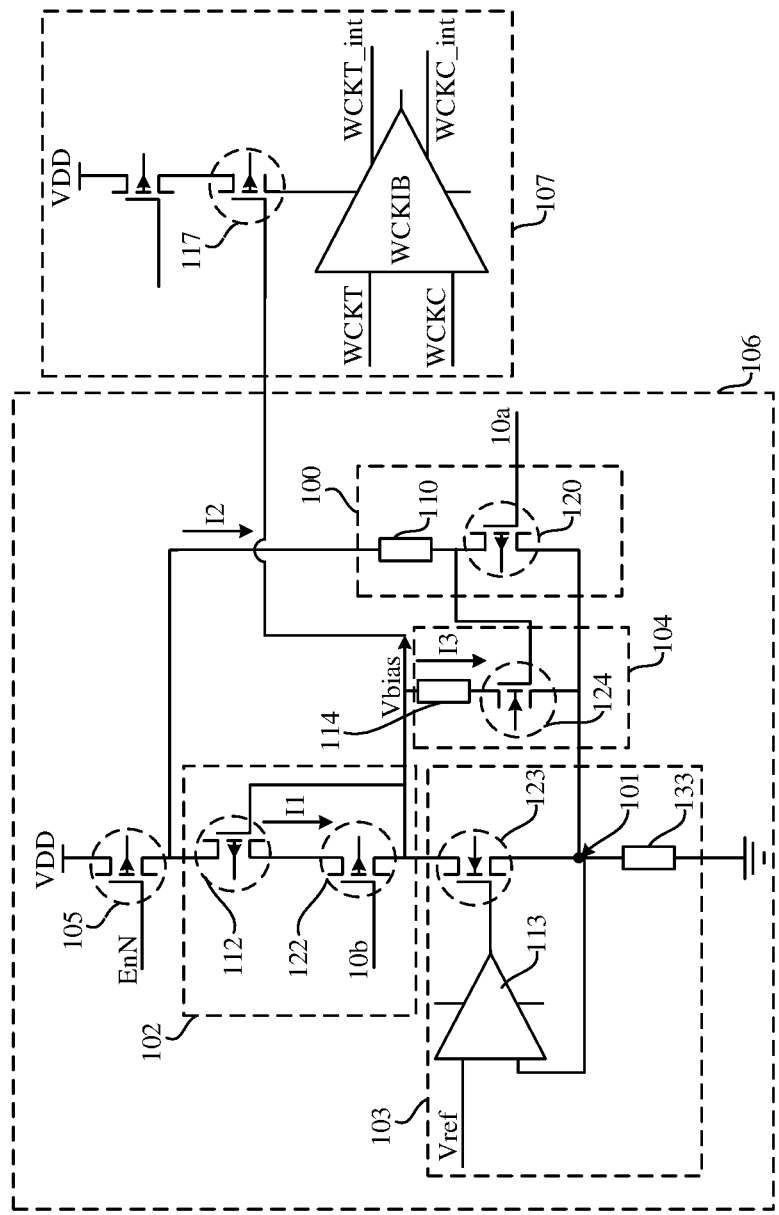
FIG. 11 is a schematic circuit diagram of a memory circuit provided by another embodiment of the disclosure.

Another embodiment of the disclosure provides a memory circuit, which includes any one bias generation circuit provided by the forgoing embodiments. The memory circuit provided by another embodiment of the disclosure is described in detail below in combination with the drawings. FIG. 11 is a schematic circuit diagram of a memory circuit provided by another embodiment of the disclosure.

Referring to FIG. 11, the memory circuit includes: any one bias generation circuits 106 provided by the forgoing embodiments; and an input buffer circuit 107 coupled to the output end of the bias circuit 102. It is to be noted that the bias generation circuit 106 is the same as the forgoing embodiment, and is not described repeatedly here anymore. Only one schematic circuit diagram of the bias generation circuit 106 is exemplarily described in FIG. 11, for facilitating illumination.

In some embodiments, the input buffer circuit 107 includes a seventh MOS transistor 117. A control end of the seventh MOS transistor 117 is coupled to the output end of the bias circuit 102 in the bias generation circuit 106, i.e., the control end of the seventh MOS transistor 117 receives the bias voltage Vbias. The control end of the seventh MOS transistor 117 can be directly electrically connected to the output end of the bias generation circuit 106.

The third MOS transistor 112 in the bias circuit 102 and the seventh MOS transistor 117 in the input buffer circuit 107 constitute a current mirror structure.

In one example, the third MOS transistor 112 and the seventh MOS transistor 117 are both PMOS transistors. As the third MOS transistor 112 serves as an input transistor, the control end of the third MOS transistor 112 is short-circuited with the second end, VDS1=VGS1<VGS1-VT1. The third MOS transistor 112 always works in a saturation area, the input resistance of the third MOS transistor 112 is low since the control end of the third MOS transistor 112 is short-circuited with the second end. VDS1 is the voltage between the second end of the third MOS transistor 112 and the first end of the third MOS transistor 112, VGS1 is the voltage between the control end of the third MOS transistor 112 and the first end of the third MOS transistor 112, and VT1 is a threshold voltage of the third MOS transistor 112.

Since the seventh MOS transistor 117 works in the saturation area, VDS2<VGS2-VT2. VDS2<VGS1-VT2 since VGS1=VGS2, and VDS2<VDS1-VT2 since VGS1=VDS1. Since VDS2 and VDS1 are both negative values, the absolute value of VDS2 is greater than that of VDS1. VDS2 is a voltage between the second end of the seventh MOS transistor 117 and the first end of the seventh MOS transistor 117, VGS2 is the voltage between the control end of the seventh MOS transistor 117 and the first end of the seventh MOS transistor 117, and VT2 is a threshold voltage of the seventh MOS transistor 117.

According to the current mirror formula, $$\frac{I_{out}}{I_{ref}} = \frac{(W_2/L_2)(1+\lambda V_{DS2})}{(W_1/L_1)(1+\lambda V_{DS1})}.$$

$I_{out}$ denotes a current value outputted by the seventh MOS transistor 117, $I_{ref}$ denotes a current value provided to the seventh MOS transistor 117 by the third MOS transistor 112, $W_1$ denotes the width of the channel of the third MOS transistor 112, $L_1$ denotes the length of the channel of the third MOS transistor 112, $V_{DS1}$ denotes a voltage between the second end of the third MOS transistor 112 and the first end of the third MOS transistor 112, $W_2$ denotes the width of the channel of the seventh MOS transistor 117, $L_2$ denotes the length of the channel of the seventh MOS transistor 117, $V_{DS2}$ denotes a voltage between the second end of the seventh MOS transistor 117 and the first end of the seventh MOS transistor 117, and $\lambda$ is a current mirror coefficient.

In order to obtain an accurate result of the current mirror, $$\frac{(1+\lambda V_{DS2})}{(1+\lambda V_{DS1})}$$

should be small, and in order to reduce t VDS1, W2 should be increased, that is, the width of the channel of the seventh MOS transistor 117 is increased to guarantee the ratio of $I_{out}$ to $I_{ref}$.

In the embodiments of the disclosure, after the fourth MOS transistor 122 is added, $I_{ref}$ is unchanged in an ideal condition, and then the bias voltage Vbias is substantially unchanged. When the fourth MOS transistor 122 is not added, VDS1=Vbias-VS1. After the fourth MOS transistor 122 is added, VDS1=VS3-VS1, VS1 is a voltage at the control end of the third MOS transistor 112, and VS3 is a voltage at the control end of the fourth MOS transistor 122. VS3 is greater than the bias voltage Vbias, both the third MOS transistor 112 and the seventh MOS transistor 117 are PMOS transistors, VDS1 is a negative value. An absolute value of VDS1 after the fourth MOS transistor 122 is added is smaller than an absolute value of VDS1 when the fourth MOS transistor 122 is not added. In addition, λ is a negative value for the PMOS transistor. Therefore, $1+\lambda V_{DS1}$ after the fourth MOS transistor 122 is added is smaller than $1+\lambda V_{DS1}$ when the fourth MOS transistor 122 is not added. Therefore, after the fourth MOS transistor 122 is added, the fourth MOS transistor 122 can be provided for guaranteeing the ratio of $I_{out}$ to $I_{ref}$ without increasing the width of the channel of the seventh MOS transistor 117.

In summary, the memory circuit includes any one bias generation circuits 106 provided by the forgoing embodiments, the bias voltage Vbias outputted by the output end of the bias circuit 102 and received by the input buffer circuit 107 is a stable value, thereby ensuring that the input buffer circuit 107 is in a stable working state.

It can be understood by those of ordinary skill in the art that the implementation modes described above are specific embodiments for implementing the disclosure, and in practical applications, various changes in form and detail may be made therein without departing from the spirit and scope of the disclosure. Any person skilled in the art may make various changes and modifications without departing from the spirit and scope of the embodiments of the disclosure, and therefore, the scope of protection of the embodiments of the disclosure should be defined by the claims.

INDUSTRIAL APPLICABILITY

The embodiments of the disclosure relate to a bias generation circuit and a memory circuit. In the bias generation circuit provided by the embodiments of the disclosure, on one hand, the voltage stabilizing circuit is coupled to the output end of the bias circuit and the regulating node, on the other hand, one end of the second load circuit is coupled to the output end of the bias circuit and the regulating node. Therefore, the voltage of the regulating node can be jointly regulated through both the voltage stabilizing circuit and the second load circuit. When the working voltage is stable, the voltage stabilizing circuit can control the voltage of the regulating node to be the fixed voltage value, thereby stabilizing the current passing through the bias circuit, and outputting the stable bias voltage. When the working voltage is excessively high, as compared with the bias generation circuit without the second load circuit, the current in the bias circuit can be increased through the second load circuit, thereby avoiding that the bias voltage outputted by the bias circuit increases or decreases excessively with change of the working voltage, so that the bias circuit outputs a bias voltage within a stable value range, and other circuits that receive the bias voltage to work are in a stable working state.

The invention claimed is:
1. A bias generation circuit, comprising:
a first load circuit coupled between a working voltage and a regulating node;
a bias circuit configured to receive the working voltage and output a bias voltage according to the working voltage;
a voltage stabilizing circuit which is coupled to an output end of the bias circuit and configured to receive a reference voltage and regulate a voltage of the regulating node according to the bias voltage and the reference voltage; and
a second load circuit having one end coupled to the output end of the bias circuit and the other end coupled to the regulating node.

2. The bias generation circuit of claim 1, wherein the voltage stabilizing circuit further comprises:
an operational amplifier having a first input end for receiving the reference voltage and a second input end coupled to the regulating node;
a drive circuit which is coupled to an output end of the operational amplifier and configured to receive the bias voltage and regulate the voltage of the regulating node according to output of the operational amplifier and the bias voltage; and
a feedback circuit coupled between the regulating node and ground.

3. The bias generation circuit of claim 2, wherein the feedback circuit comprises a first resistor coupled between the regulating node and the ground.

4. The bias generation circuit of claim 2, wherein the drive circuit comprises a first Negative channel-Metal-Oxide-Semiconductor (NMOS) transistor, a control end of the first NMOS transistor is coupled to the output end of the operational amplifier, a first end of the first NMOS transistor is coupled to the output end of the bias circuit, and a second end of the first NMOS transistor is coupled to the regulating node.

5. The bias generation circuit of claim 1, wherein the first load circuit comprises a second resistor coupled between the working voltage and the regulating node.

6. The bias generation circuit of claim 1, wherein the first load circuit comprises a first metal oxide semiconductor (MOS) transistor, a first end of the first MOS transistor is coupled to the working voltage, a second end of the first MOS transistor is coupled to the regulating node, and the first MOS transistor conducts the first end of the first MOS transistor and the second end of the first MOS transistor in respond to a first control voltage signal.

7. The bias generation circuit of claim 1, wherein the first load circuit comprises:
a second resistor having one end coupled to the working voltage; and
a first metal oxide semiconductor (MOS) transistor, wherein a first end of the first MOS transistor is coupled to the other end of the second resistor, a second end of the first MOS transistor is coupled to the regulating node, and the first MOS transistor conducts the first end and the second end of the first MOS transistor in respond to a first control voltage signal.

8. The bias generation circuit of claim 7, wherein the second load circuit comprises a second MOS transistor, wherein a control end of the second MOS transistor is coupled to the first end of the first MOS transistor, a first end of the second MOS transistor is coupled to the output end of the bias circuit, and a second end of the second MOS transistor is coupled to the regulating node.

9. The bias generation circuit of claim 7, wherein the second load circuit comprises:
a third resistor having one end coupled to the output end of the bias circuit; and a second MOS transistor, wherein a control end of the second MOS transistor is coupled to the first end of the first MOS transistor, a first end of the second MOS transistor is coupled to the other end of the third resistor, and a second end of the second MOS transistor is coupled to the regulating node.

10. The bias generation circuit of claim 8, wherein the first MOS transistor is of one of N-type or P-type, and the second MOS transistor is of the other of N-type or P-type.

11. The bias generation circuit of claim 1, wherein the second load circuit comprises a third resistor coupled between the output end of the bias circuit and the regulating node.

12. The bias generation circuit of claim 1, wherein the bias circuit comprises a third metal oxide semiconductor (MOS) transistor, wherein a control end of the third MOS transistor is coupled to the output end of the bias circuit, a first end of the third MOS transistor is coupled to the working voltage, and a second end of the third MOS transistor is coupled to the output end of the bias circuit.

13. The bias generation circuit of claim 12, wherein the bias circuit further comprises a fourth MOS transistor, wherein a first end of the fourth MOS transistor is coupled to the second end of the third MOS transistor, a second end of the fourth MOS transistor is coupled to the output end of the bias circuit, and a control end of the fourth MOS transistor conducts the first end and second end of the fourth MOS transistor in respond to a second control voltage signal.

14. The bias generation circuit of claim 1, further comprising a switch circuit configured to be turned on in response to an enable signal, to enable the first load circuit to be coupled to the working voltage via the switch circuit, and enable the bias circuit to receive the working voltage via the switch circuit.

15. The bias generation circuit of claim 14, wherein the switch circuit comprises a sixth metal oxide semiconductor (MOS) transistor.

16. A memory circuit, comprising:
a bias generation circuit, wherein the bias generation circuit comprises: a first load circuit coupled between a working voltage and a regulating node; a bias circuit configured to receive the working voltage and output a bias voltage according to the working voltage; a voltage stabilizing circuit which is coupled to an output end of the bias circuit and configured to receive a reference voltage and regulate a voltage of the regulating node according to the bias voltage and the reference voltage; and a second load circuit having one end coupled to the output end of the bias circuit and the other end coupled to the regulating node; and
an input buffer circuit coupled to the output end of the bias circuit.

17. The memory circuit of claim 16, wherein the input buffer circuit comprises:
a seventh metal oxide semiconductor (MOS) transistor, wherein a control end of the seventh MOS transistor is coupled to the output end of the bias circuit in the bias generation circuit.

18. The memory circuit of claim 17, wherein the bias circuit comprises a third metal oxide semiconductor (MOS) transistor, wherein a control end of the third MOS transistor is coupled to the output end of the bias circuit, a first end of the third MOS transistor is coupled to the working voltage, and a second end of the third MOS transistor is coupled to the output end of the bias circuit.

19. The memory circuit of claim 18, wherein the third MOS transistor in the bias circuit and the seventh MOS transistor in the input buffer circuit constitute a current mirror structure.

20. The memory circuit of claim 17, wherein the control end of the seventh MOS transistor is directly electrically connected to the output end of the bias generation circuit.

\* \* \* \* \*